(12) United States Patent
Booz et al.

(10) Patent No.: US 8,829,360 B2
(45) Date of Patent: Sep. 9, 2014

(54) CONNECTOR FOR PV CELLS AND METHOD FOR ITS PRODUCTION

(75) Inventors: Thomas Booz, Roth (DE); Fabian Distelrath, Roth (DE)

(73) Assignee: Schlenk Metallfolien GmbH & Co. KG, Roth (DE)

( * ) Notice: Subject to any disclaimer, the term of this patent is extended or adjusted under 35 U.S.C. 154(b) by 343 days.

(21) Appl. No.: 13/172,473

(22) Filed: Jun. 29, 2011

(65) Prior Publication Data

US 2012/0132247 A1    May 31, 2012

(30) Foreign Application Priority Data

Nov. 26, 2010 (DE) .................... 20 2010 015 934 U
Jan. 20, 2011 (DE) ........................ 10 2011 009 006

(51) Int. Cl.
*H05K 1/11* (2006.01)
*H05K 1/02* (2006.01)
(Continued)

(52) U.S. Cl.
CPC ............ *B21D 13/04* (2013.01); *H01L 31/0508* (2013.01); *Y02E 10/50* (2013.01)
USPC ........... 174/261; 174/259; 136/244; 136/252; 136/256

(58) Field of Classification Search
USPC ................. 174/250, 253, 254, 257, 259, 261; 136/245, 252, 256, 244
See application file for complete search history.

(56) References Cited

U.S. PATENT DOCUMENTS 4,301,322 A    11/1981  Amick
4,574,160 A *   3/1986  Cull et al. ................... 136/245

(Continued)

FOREIGN PATENT DOCUMENTS

DE    3612269 A1    10/1987
DE    4038765 A1     6/1992
(Continued)

OTHER PUBLICATIONS

Sachs, Emanuel M. et al., "Light-Capturing Interconnect Wire for 2% Module Power Gain", 24th European Photovoltaic Solar Energy Conference, Hamburg, Germany, Sep. 21-25, 2009, pp. 3222-3225.
Preu, R., "Optimisation of Cell Interconnectors for PV Module Performance Enhancement", 14th European Photovoltaic Solar Energy Conference, Barcelona, Spain, Jun. 20-Jul. 4, 1997, pp. 278-281.

*Primary Examiner* — Hoa C Nguyen
(74) *Attorney, Agent, or Firm* — Buchanan Ingersoll & Rooney PC (57) ABSTRACT

The connector for PV cells is a strip of electrically conductive material which has a flat cross-section with two broad sides and with two narrow sides which each connect opposite edges of the broad sides. At least one broad side has a corrugated structure running in longitudinal direction of the strip and is pre-tinned in an area the length of which is somewhat less than the length of the edge of a PV cell. To produce the pre-tinned strips, in a first step a metal foil is guided through a roll gap of a rolling mill in which at least one work roll has a surface with a corrugated structure with the result that a corrugated structure which has crests or peaks and troughs is embossed into at least one side of the metal foil, in a second step soldering tin in the form of solder preforms is applied to the side of the metal foil with the embossed corrugated structure, wherein the soldering flux necessary for pre-tinning has been applied in advance to the solder preforms or the metal foil, in a third step the solder preforms are connected to the metal foil and melted on and in a fourth step the pre-tinned metal foil with the embossed corrugated structure is separated into parallel ribbons. The solder preforms are sufficiently thick for the corrugated structure to be at least full after the solder preforms have been melted on.

10 Claims, 4 Drawing Sheets

(51) Int. Cl.
*B21D 13/04* (2006.01)
*H01L 31/05* (2014.01)
*H01L 31/042* (2014.01)

(56) References Cited

U.S. PATENT DOCUMENTS

| | | | |
|---|---|---|---|
| 7,998,760 B2 * | 8/2011 | Tabe | 438/15 |
| 2006/0272844 A1 * | 12/2006 | Berghofer et al. | 174/94 R |
| 2007/0125415 A1 * | 6/2007 | Sachs | 136/205 |
| 2009/0255569 A1 | 10/2009 | Sampsell et al. | |

FOREIGN PATENT DOCUMENTS

| | | |
|---|---|---|
| DE | 102006035626 | 2/2008 |
| DE | 102008044354 A1 | 6/2010 |
| EP | 1626443 A1 | 2/2006 |
| JP | 4646558 B2 | 3/2011 |
| WO | WO 2006128203 A1 | 12/2006 |

* cited by examiner

CONNECTOR FOR PV CELLS AND METHOD FOR ITS PRODUCTION

FIELD OF THE INVENTION

The invention relates to a connector for PV cells (photovoltaic cells or wafers; In the following "PV cell" will be meant to include "PV wafer".) comprising a strip of electrically conductive material which has a flat cross-section with a first and a second broad side extending over its entire length and with two narrow sides which each connect opposite edges of the broad sides, wherein at least the first broad side has a corrugated structure running in longitudinal direction of the strip. The invention also relates to a method for producing such connectors for PV cells.

BACKGROUND

Connectors for PV cells are usually supplied wound as long ribbons on rolls and are then cut off individually from these ribbons. The definition of the first and second broad side or the top and bottom is governed by the winding in the finished supplied form and can to this extent be as desired. In the present description, the first broad side or top is designated the side facing the incoming sunlight (so-called "sunny side").

Connectors are used in photovoltaics in order to connect the individual PV cells to a PV module. Five PV cells for example are series-connected by means of the connectors. Each connector creates the electrical connection between two consecutive cells of a PV module. As a rule the connectors are used with PV cells of crystallized silicon. However, they can also be used in thin-film PV cells. The connectors are to securely join together the electric poles (positive and negative) of adjacent cells within the PV module, corresponding to the desired connection. As the PV cells are connected in series (positive to negative) and the orientation of the poles of each cell is the same, the connector is soldered to the top (so-called "sunny side") of one cell and then to the bottom (so-called "shady side") of the next cell.

Conventional connectors of PV cells are strips of electrically conductive material, generally copper, wherein both broad sides are smooth. Depending on the production method, the strip is pre-tinned with a soft solder on all sides (dip-tinned rolled wire) or on two sides (slit ribbon). The solder coating is applied evenly along the entire length of the connector, generally evenly in the same thickness on both sides. The crosswise thickness distribution of the tin layer may vary depending on the production method. In the case of dip-tinned wire a lens forms. With the cut ribbon the thickness of the solder layer remains constant over the width.

PV cell connectors with a corrugated structure are known from the publication "OPTIMISATION OF CELL INTERCONNECTORS FOR PV MODULE PERFORMANCE ENHANCEMENT", 14th EUROPEAN PHOTOVOLTAIC SOLAR ENERGY CONFERENCE, BARCELONA, SPAIN, 30 Jun. to 4 Jul. 1997, as well as from US-2007/0125415 A1 and from JP 2006-013406. As described in these publications, with an optimum angle at the peaks of the corrugated structure of 100-140°, preferably 120°, approximately 80% of the light striking the connectors can be made usable for electricity generation by total reflection within the PV cell, whereby the overall efficiency of the PV cell is improved by approximately 2%. The surface of the corrugated structure can be silver-plated to increase the reflection. It is not stated in these published documents how the connectors are to be soldered to the PV cells. Conventional connectors with flat broad sides are pre-tinned by dip soldering. With connectors with a corrugated structure this does not lead to an adequate pre-tinning which allows the connectors to be soldered in an automated procedure. Connectors with a corrugated structure could therefore be soldered onto PV cells only by external solder feed, e.g. by means of a dispensing head.

Therefore there is a need to create a connector with a corrugated structure on at least one of the two broad sides which can be easily and reliably soldered to PV cells, as well as a method for producing such PV cell connectors.

SUMMARY

The subject of the invention is a connector for PV cells comprising a strip of electrically conductive material which has a flat cross-section with a first and a second broad side extending over its entire length and with two narrow sides which each connect opposite edges of the broad sides, wherein the first broad side has a corrugated structure running in longitudinal direction of the strip and wherein the first broad side is pre-tinned in a first area the length of which is somewhat less than the length of the edge of a PV cell.

Preferably the second broad side also has a corrugated structure running in longitudinal direction of the strip. The strip then also has a light-reflecting corrugated structure on the bottom (so-called "shady side"). The corrugated structure can be identical or different on both broad sides.

The second broad side is preferably also pre-tinned in a second area, the length of which is somewhat less than the length of the edge of a PV cell.

As supplied, i.e. in long ribbons wound on rolls, the ribbons of the PV cell connectors expediently have a constant sequence of the solder surfaces of the first areas of the first broad side or of the first and second areas on the respective broad side. However, the length of the solder surfaces of the pre-tinning of the first broad side or the two broad sides can also be different. The solder surface(s) can be non-continuous. The lengths of the untinned surfaces in front of and behind a solder surface may differ. However, they preferably repeat at the same interval. The sequence of the pre-tinned areas and untinned areas on the first and second broad side is generally fixed and defined.

Preferably the first area and the second area are separated in longitudinal direction of the strip by a gap which roughly corresponds to the distance between two PV cells connected to one another. With four-inch cells the first and second area are typically 71.0 mm long and the distance between these two areas is typically 7.7 mm. As the connectors are cut from a continuous ribbon, a cutting tolerance of 0.5 mm must be taken into account. In total a connector is thus typically 150.2 mm long.

With six-inch cells the first and second area are typically 145.0 mm long and the distance between these two areas is typically 15 mm. Together with a cutting tolerance of 0.5 mm, a connector is thus typically 305.5 mm long.

The connector is preferably pre-tinned at least in the first area with a quantity of solder such that the corrugated structure running in longitudinal direction is at least full. Preferably the solder stands slightly higher than the crests or peaks of the corrugated structure. The small excess is expedient for a successful soldering.

Because the solder stands only slightly higher than the crests or peaks of the corrugated structure and thus the soldering surface barely stands higher than the untinned surface, long ribbons of the selectively tinned PV cell connectors can be wound onto large single-layer or transverse (cross-wound) rolls and the PV cell connector according to the invention can be processed in long lengths. With a smooth copper strip the selective tinning would clearly increase the thickness and rigidity of the strip in the pre-tinned areas which then makes it impossible to wind on the ribbon evenly.

The corrugated structure preferably has a peak-to-peak distance, i.e. distance between the corrugations, of between 150 and 250 μm. Shorter distances reduce the yield due to losses at the tips (crests or peaks) of the corrugations. The longer the selected distance, the deeper the profile of the corrugated structure, which can lead to manufacturing problems. Moreover, the strip as a whole therefore becomes unnecessarily thick. A peak-to-peak distance of 150 μm is particularly preferable.

Before pre-tinning the corrugated strip, made of conductive material, of the connector can be either bare or coated on one or both sides with silver, tin or nickel. Preferably the corrugated structure of the first broad side is coated with silver to improve the reflection properties. The pre-tinning is applied to the thin silver layer. The same applies to the second broad side if this likewise has a corrugated structure.

The untinned surfaces between the solder surfaces can be provided with an insulation layer.

The electrically conductive material of the strip is preferably a metal, generally—as already mentioned—copper.

The subject of the invention is also a metal foil made of electrically conductive material with a corrugated structure running in one direction on at least a first side of the metal foil, wherein at least the first side of the metal foil has areas which run transverse to the direction of the corrugated structure and are pre-tinned.

Preferably the pre-tinning fills up the corrugated structure and stands slightly higher than the peaks of the corrugated structure.

The subject of the invention is also a ribbon in which connectors for PV cells according to the invention are arranged in one or more rows behind or alongside one another.

The subject of the invention is also a method for producing pre-tinned strips of the connectors according to the invention for PV cells which comprises the steps:
  guiding a metal foil through a roll gap of a rolling mill in which at least one work roll has a surface with a corrugated structure with the result that a corrugated structure which has crests or peaks and troughs is embossed into at least one side of the metal foil,
  applying soldering tin in the form of solder preforms (foil sections) to the side of the metal foil which has an embossed corrugated structure, wherein the soldering flux necessary for the tinning has been applied in advance to the solder preforms or the metal foil,
  connecting the solder preforms to the metal foil,
  melting the solder preforms onto the metal foil,
  separating the tinned metal foil with the embossed corrugated structure into parallel ribbons,
wherein the solder preforms are sufficiently thick for the corrugated structure to be full after the solder preforms have been melted on.

The ribbons can be wound onto narrow (single layered) or transverse (cross-wound) rolls. The individual connectors are then cut off from these ribbons.

Preferably the solder preforms are connected to the metal foil by placing the pre-cut solder preforms onto the metal foil by means of a suction gripper, the solder preforms still held in place by the suction gripper are temporarily attached pointwise with a first hot embossing head to the metal foil, the temporarily attached solder preforms are then pressed with a second hot embossing head over the whole surface with the metal foil, wherein the temperature is a few degrees Celsius below the liquidus temperature, with the result that the solder is soft or pulpy, and by finally the temporarily attached solder performs that have been pressed over the whole surface are melted on.

The solder preforms are tin-solder foil cuts and are sufficiently thick for the pre-tinning to at least fill the corrugated structure running in longitudinal direction. In order to make the processing in long lengths of pre-tinned connectors possible to be made from the metal foil, the pre-tinned areas expediently stand only slightly higher than the crests or peaks of the untinned corrugated structure. The corrugated structure contains nearly all of the solder material with the result that the solder material stands only slightly higher than the crests or peaks of the corrugated structure. Preferably the solder preforms are sufficiently thick for at least the first area to be pre-tinned with a quantity of solder such that the solder fills the corrugated structure and stands slightly higher than the crests or peaks of the corrugated structure. As already mentioned, the small excess is expedient for a successful soldering.

If the second broad side of the strip is also to have a corrugated structure running in longitudinal direction of the strip, the other roll of the roll mill preferably also has a corrugated structure, with the result that the metal foil contains a corrugated structure on both broad sides. The design of the corrugated structure can be identical on both sides or different.

If the metal foil has the corrugated structure only on one broad side, the top, the other, smooth broad side, the bottom, can be tinned over its whole surface e.g. by wave soldering. The top need then be tinned only in the areas which later become the areas with which the PV cell connectors to be produced are soldered onto the back of the PV cells.

The metal foil is preferably 0.1 to 0.25 mm thick and 30 to 90 mm wide. The width can even be as small as 5 mm. The rolls preferably have a surface with a corrugated structure with a peak-to-peak distance of 150-250 μm and a depth of approximately 30 to 50 μm, with the result that the optimum angle α of 100-140°, preferably 120°, results at the peaks of the corrugated structure. The corrugated structure of the metal foil then has crests or peaks and troughs running in longitudinal direction or machine direction of the rolling mill.

The metal foil used can be either bare or coated on one or both sides with silver, tin or nickel. The metal foil is preferably coated with silver to improve the reflection properties of the PV cell connector produced from same. The pre-tinning is applied to the thin silver layer. The same applies to the second broad side if this also has a corrugated structure.

Only those areas of the corrugated metal foil which then later form the sections of the connector which are soldered to the PV cells are pre-tinned. The solder preforms are strips, the width of which corresponds to the length of the first and second areas of the strip of the connector, thus somewhat less than the lengths of the sides of the PV cells for which the strips which are to be produced.

With a metal foil from which connectors for four-inch cells are to be produced, the solder preforms are typically 71 mm long in longitudinal direction, i.e. slightly shorter than the length of the edge of the four-inch cell. If connectors for six-inch cells are to be produced from the metal foil, the solder preforms are typically 145 mm long in longitudinal direction. The areas are correspondingly larger with larger PV cells.

If both sides of the metal foil are pre-tinned the distance in longitudinal direction between the areas of the top onto which the solder preforms have been melted on and the areas of the bottom onto which the solder performs have been melted on roughly corresponds to the distance between two PV cells to be connected to one another. The first areas and the second areas of the PV cell connector later cut from the metal foil then also have this gap in longitudinal direction. This distance is typically 7.7 mm with four-inch cells and 15 mm with six-inch cells. As the connectors are cut from a continuous ribbon, a cutting tolerance of 0.5 mm must also be taken into account. Overall there results a typical connector length and thus a grid of the solder preforms of 150.2 and 305.5 mm respectively.

With other PV cells the first and second areas and accordingly the dimensions of the solder preforms in longitudinal or conveyance direction are correspondingly smaller or larger.

The corrugated structure of the rolling mill work rolls can be circumferential or axis-parallel and the corrugated structure in the foil runs accordingly in machine direction through the roll gap or transverse to same.

If the corrugated structure of the work rolls is circumferential the foil is still cut in longitudinal direction into narrow, parallel ribbons, wherein the width of the ribbon is equal to the width of the PV connectors. This ribbon is generally wound onto narrow, single-layer or transverse rolls. The individual connectors are then cut off from these ribbons.

If the corrugated structure of the rolls is axis-parallel the width of the ribbon coming from the rolling is expediently equal to the length of the PV connectors to be produced. The ribbon is wound onto a single-layer roll and the PV connectors are then cut off from the ribbon.

Preferably the corrugated structure of the rolls is circumferential and the corrugated structure of the foil runs in longitudinal direction.

The untinned surfaces between the solder surfaces can be provided with an insulation layer. Before or—preferably—after the placement, temporary attaching, hot pressing over the whole surface and melting on of the solder preforms, an insulation foil can be applied by hot sealing.

The dimensions mentioned above of the metal foil and the corrugated structure are typical values and the invention is not limited to these values.

Preferably, notches along which the metal foil can be split into the PV cell connectors are introduced into the metal foil in addition to the corrugated structure at distances from 1 to 5 mm running in the direction of the corrugated structure.

The connectors can then preferably be produced in a total of four steps:

In the first step the metal foil or the copper ribbon preferably from 0.1 to 0.25 mm thick and from 30 to 90 mm wide is guided through a first roll gap, the two work rolls of which have circumferential protruding wedge-shaped ribs at a distance of 1 to 5 mm which emboss the corresponding wedge-shaped notches into the metal foil to such a depth that the material strength of the metal foil in these notches is reduced to approximately 40% and thus lines of weakness form. The material of the metal foil is slightly pushed out at the edges of the notches and ridges are formed along each notch. The metal foil is therefore smoothed again in a second roll gap with smooth work rolls. The wedge-shaped notches are largely closed again but the lines of weakness remain and form weakened lines.

In the second step the metal foil weakened along these weakened lines is guided through a third roll gap which is a roll gap of the rolling mill already mentioned above, in which at least one work roll has a surface with the corrugated structure with the result that a corrugated structure is embossed into the metal foil. The corrugated structure has a peak-to-peak distance of 150-250 µm and a depth of approximately 30 to 50 µm. If possible the metal foil is introduced into the third roll gap such that the lines of weakness coincide with a peak of the corrugated structure of the rolls and accordingly with a trough of the corrugated structure of the metal foil. However, this does not always occur and is also not necessary.

In the third production step as mentioned above only those sections of the corrugated metal foil which then later form the connector cut-offs which are soldered to the PV cells are pre-tinned.

In the fourth production step the corrugated metal foil pre-tinned in transverse strips is split into narrow ribbons of foil along the lines of weakness. For this, the metal foil is guided through a fourth roll gap. A separator is arranged after the fourth roll gap, e.g. a fixed separating roll or a separating wedge, and adjacent foil ribbons are alternately guided over and under the separator and thereby broken along the lines of weakness and separated from one another. Each thus-obtained foil ribbon is then wound onto a narrow roll or a cross-wound roll.

In a standardized known production method the individual connectors can be cut from foil ribbons and used to connect the front side of one PV cell to the back of the following PV cell. The first and second production step of the connectors can also be combined by guiding the metal foil through a first roll gap the two work rolls of which have, 2 to 5 mm apart, circular protruding wedge-shaped ribs and between them a surface with a corrugated structure with a peak-to-peak distance of 150-250 µm and a depth of approximately 30 to 50 µm. However, smooth-rolling of the edge ridges of the wedge-shaped notches must be dispensed with, as the corrugated structure between the notches would thereby also be smoothed.

This four-step method can also be used with an axis-parallel corrugated structure of the roll(s) of the third roll gap, wherein the ribs of the roll(s) of the first roll gap then also run axis-parallel.

The four production steps can be carried out in a continuous process. Generally, however, the metal foil is wound up after each production step and then unwound for the next production step. This is expedient in particular because the metal foil is transported at a uniform speed in the first two and in the fourth production steps, while in the third production step (pre-tinning) it is moved forwards stepwise according to the length of the solder preforms.

The width of the foil used and of the ribbon finally produced can also be a multiple of the width or length of the PV connectors. The ribbons are then firstly wound up in this wider form and not cut to the final measurement in longitudinal direction or transverse direction until before soldering to the PV cells.

BRIEF DESCRIPTION OF THE DRAWINGS

An embodiment example of the invention is described below in more detail with the help of the drawings. There are shown in.

DETAILED DESCRIPTION

Figure 1:
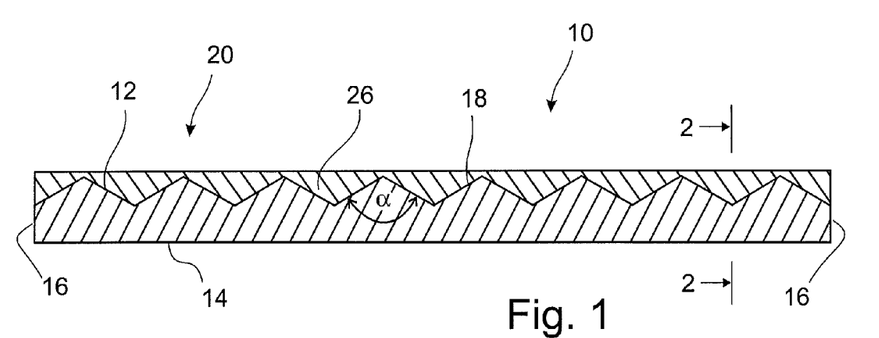
FIG. 1 a pre-tinned area of a connector for PV cells in cross-section.
Figure 2:
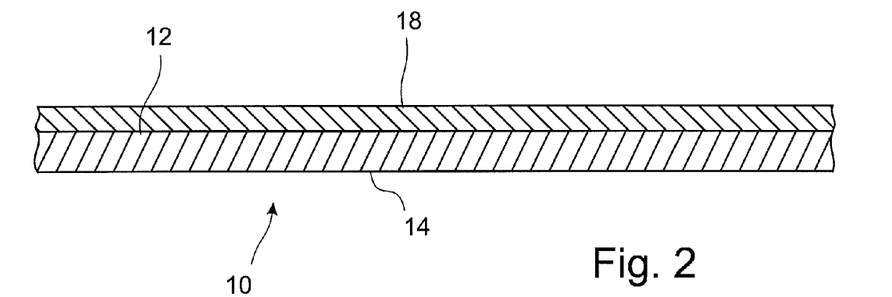
FIG. 2 the connector from FIG. 1 in longitudinal section.
Figure 3:
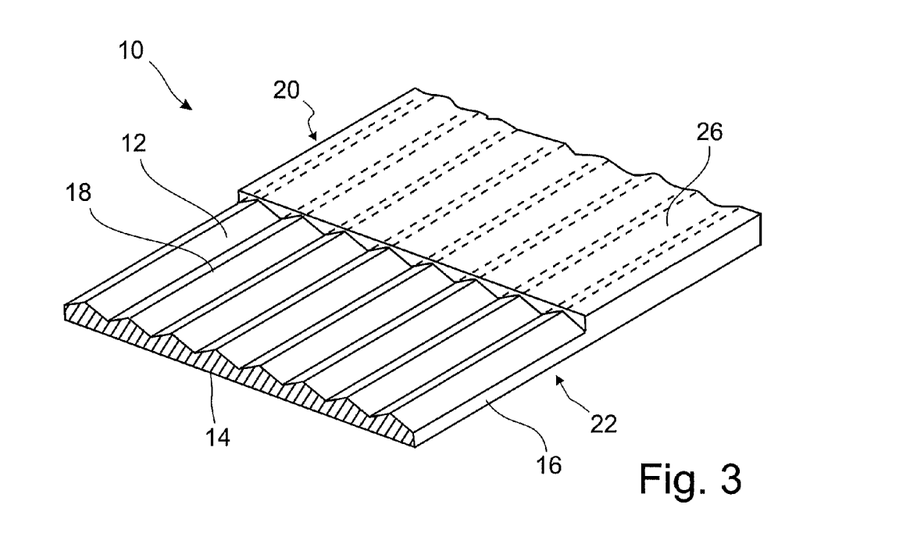
FIG. 3 an untinned and a pre-tinned area of the connector for PV cells in a three-dimensional isometric representation.

The pre-tinned connector for PV cells 29 (FIGS. 4 and 5) is a strip 10 with a flat cross-section and a first, top broad side 12 and a second, bottom broad side 14 as well as two narrow sides 16, each of which connects the opposite edges of the broad sides 12, 14. The cross-section of the strip 10 is 1 mm wide and 0.1 mm high (FIG. 1). The strip 10 has a copper core and on its top and bottom broad sides 12, 14 a thin layer of silver to improve electrical conductivity and reflection capability. The layer of silver is not shown in the drawings.

While the bottom broad side 14 is smooth, the top broad side 12 has a corrugated structure 18 with a triangular profile (FIG. 1) with an angle α of 120° at the peak and in the trough. The peak-to-peak distance in the corrugated structure 18 is 150 μm and the depth of the corrugated structure is accordingly approximately 40 μm. The strip is intended for a PV connector for six-inch cells and is thus 305.5 mm long. It is divided into three areas. In a first area 20, 145 mm long, the strip is pre-tinned on the top broad side 12 which holds the corrugated structure 18, and the corrugated structure 18 is filled with the soldering tin 26 such that viewed from the outside the strip 10 in the first area 20 is almost smooth. The soldering tin 26 actually stands a few micrometers higher than the peaks of the corrugated structure 18. An intermediate area 22, in which the strip 10 is not tinned either on the top broad side 12 or on the bottom broad side 14, joins onto the first area 20. The intermediate area 22, which acts as connection area, is 15 mm long. A second area 24, which again is 145 mm long and which has a pre-tinned bottom broad side 14, joins onto it. The thickness of the pre-tinning is approximately 10 μm. Including a cutting tolerance of 0.5 mm, the length of the strip 10 is thus 305.5 mm.

Figure 4:
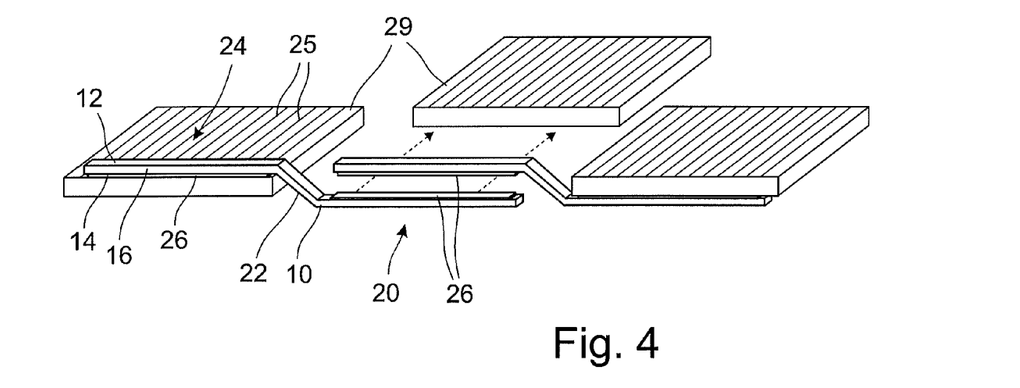
FIG. 4 in an exploded view three PV cells with the associated connectors.
Figure 5:
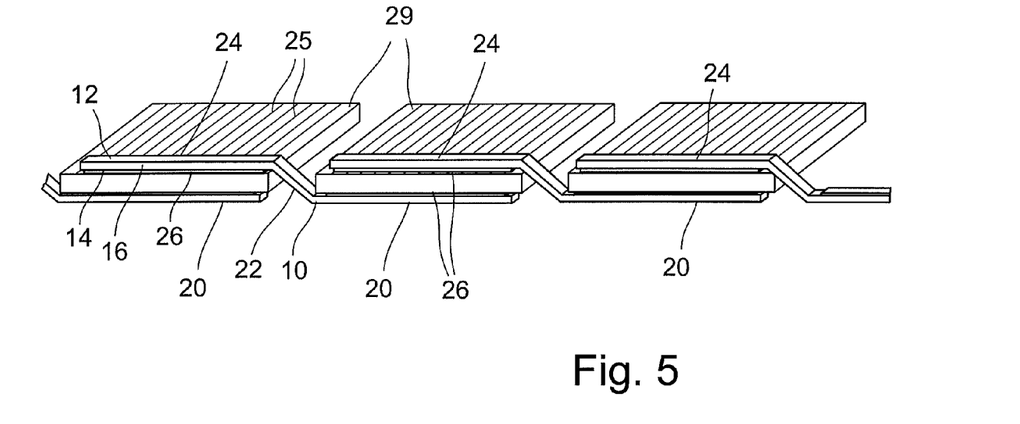
FIG. 5 the three PV cells from FIG. 4 connected.

The length of the first and second areas 20, 24 is somewhat less than the length of the edge of a six-inch cell (FIGS. 4 and 5). The connection area 22 corresponds to the distance between two PV cells 29 within a module. The bottom broad side 14 of the second area 24 is soldered to the top of a PV cell 29 with the result that a connection to the individual contact fingers 25 of the PV cell 29 forms. As the PV cells 29 are connected in series, the first area 20, in which the corrugated structures 18 are completely filled with soldering tin 26, is soldered to the bottom of the adjacent PV cell 29, with the result that there is likewise contact with the contact fingers. The second area 24 of the next connector, the first area 20 of which is again soldered to the bottom of the next-but-one PV cell 29, is then soldered onto the top of this PV cell 29. In this way a majority of PV cells is connected in series.

Figure 6:
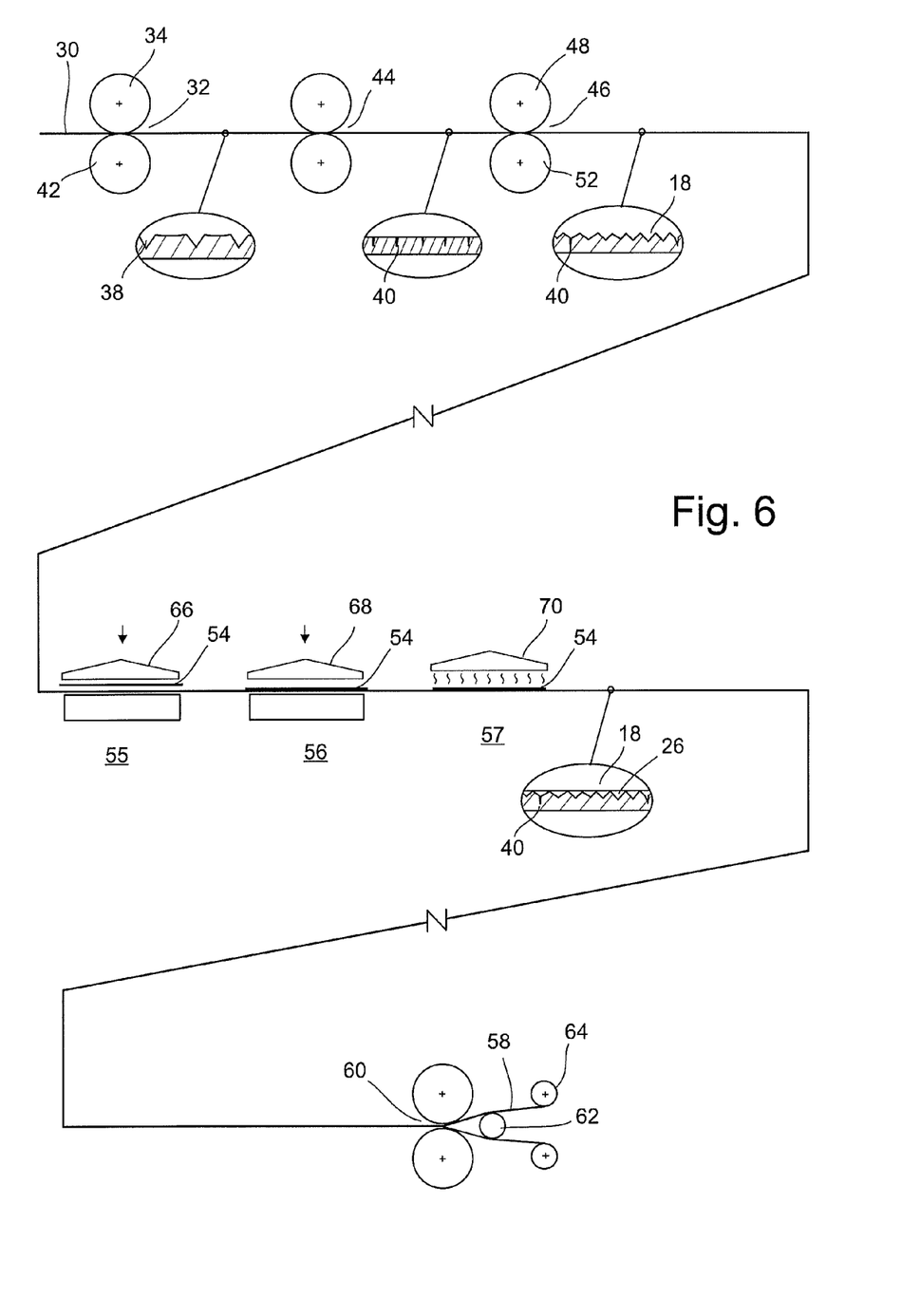
FIG. 6 schematically, the production method of the connectors for PV cells.
Figures 7, 8, 9, 10:
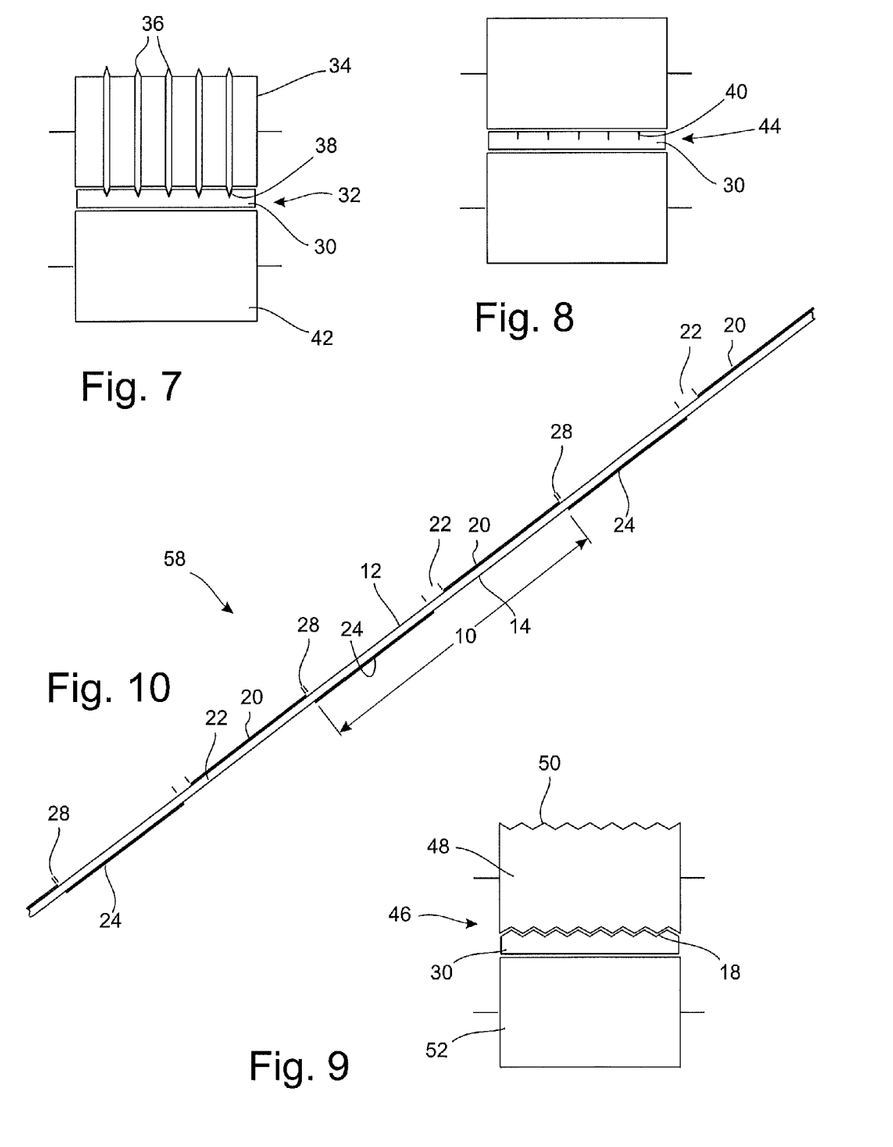
FIG. 7 the first roll gap in section.
FIG. 8 the second roll gap in section.
FIG. 9 the third roll gap in section.
FIG. 10 a piece of a foil ribbon which is a sequence of pre-tinned strips.

The pre-tinned connectors for PV cells with a corrugated structure on one side are produced in four steps (FIG. 6):

In a first step a copper foil or ribbon 30, 0.1 mm thick and 30 mm wide, is guided through a first roll gap 32, the top work roll 34 of which has circumferential protruding wedge-shaped ribs 36 spaced 1 mm apart, which emboss corresponding wedge-shaped notches 38 into the copper foil 30 to a depth of 60 μm (FIG. 7), with the result that lines of weakness 40 form (FIGS. 6 and 8). The bottom work roll 42 is smooth. The material of the copper foil 30 is slightly squeezed out at the edges of the notches 38 and thus ridges form. The copper foil 30 is therefore smoothed again in a second roll gap 44 with smooth work rolls. The wedge-shaped notches 38 are largely closed again but the lines of weakness 40 remain and form break-off lines (FIG. 8).

In a second step the copper foil 30 is guided through a third roll gap 46, the top work roll 48 of which has a surface with a corrugated structure 50 with a peak-to-peak distance of 150 μm and a depth of approximately 40 μm (FIG. 9). The corrugated structure 50 has longitudinal crests or peaks and troughs. The angle α at the crests and in the troughs of the corrugated structure 50 is 120°. The bottom work roll 52 of the third roll gap 46 is smooth. In the third roll gap 46 the corrugated structure 50 of the top roll 48 embosses the corresponding corrugated structure 18 into the copper foil 30. The copper foil 30 is introduced into the third roll gap 46 such that the lines of weakness 40 coincide with a crest of the corrugated structure 50 of the top work roll 48 and accordingly with a trough of the corrugated structure 18 embossed into the copper foil 30.

In a third production step those sections of surface of the copper foil 30 which later become the first areas 20 of the top broad side 12 and the second areas 24 of the bottom broad side 14 of the connector which are soldered to the PV cells 29 are then pre-tinned. For this, soldering tin is applied to the copper foil 30 in the form of solder preforms 54 (FIG. 6). The soldering flux necessary for the tinning has been applied to the solder preforms 54 or onto the ribbon 10 in advance. The solder preforms 54 are connected to the copper foil 30 by means of a three-stage method. In the first stage 55 the solder preforms 54 are temporarily attached by pointwise hot embossing by means of a first hot embossing head 66 which has two embossing stamps. A pre-cut solder preform 54 is placed in position and held on the temporarily attached copper foil 30 by means of a suction gripper. The suction gripper has two spaced recesses through which the two dies of the first hot embossing head 66 travel and at these points temporarily attach the solder preform 54 to the copper foil 30 by heat and pressure. The copper foil 30 with the temporarily attached solder preform 54 is then clocked further and in the second stage 56 the solder preforms 54 are again pressed over their whole surface by hot embossing by means of a second hot embossing head 68. The copper foil 30 with the pressed solder preform 54 is then clocked further again and in the third stage the temporarily attached solder preforms 54 that have been pressed over their whole surface are melted on by means of an infrared radiator 70.

The solder preforms 54 are strips of soldering tin, the width of which is somewhat less than the 156-mm length of the edge of a six-inch PV cell at 145 mm. The soldering tin strips 54 are laid transverse to the corrugated structure 18 of the copper foil 30.

In a fourth production step the corrugated copper foil 30, pre-tinned in transverse strips, is split into narrow ribbons of foil 58 along the lines of weakness 40. For this, the copper foil 30 is guided through a fourth roll gap 60 with smooth work rolls which exert no, or only a minimal, pressure on the foil 30. A fixed separating roll 62 is arranged as separator after the roll gap, and adjacent foil ribbons 58 are alternately guided over and under the separating roll 62 and separated from one another along the lines of weakness 40. Each thus-obtained foil ribbon 58 is then wound onto a cross-wound roll 64.

If the copper foil 30 is not to have lines of weakness 40, the first and second roll gaps 32, 44 are omitted. The copper foil 30, provided with the corrugated structure 18 and pre-tinned, is then divided into the foil ribbons 58 by means of roll slitters.

As the first two and the fourth production step proceed continuously, while the metal foil 30 is moved forwards in steps in the third production step, the pre-tinning, the metal foil 30 is wound up after the first two production steps and then unwound for the third production step. Likewise it is wound up after the third production step and then unwound again for the fourth production step. The interim winding up is shown in FIG. 6 by the breaks in the line representing the copper foil 30. The copper foil 30 can also be temporarily wound up after passing through the first and second roll gap 32, 44.

The strips 10 of the PV cell connectors usually have a corrugated structure 18 on the bottom and top broad side 12, 14. To produce such a PV cell connector the bottom roll 42 of the first roll gap 32 then also has a corrugated structure 50. Areas of both broad sides of the metal foil 30 are then usually tinned. The tinned areas of the top broad side 12 and bottom broad side 14 of the metal foil 30 do not overlap, but are separated in longitudinal direction by a gap which alternately roughly corresponds to the distance between two PV cells 29 to be connected to one another and a cutting tolerance of 0.5 mm.

Both sides of the metal foil 30 can also be tinned over their whole surface. PV cell connectors cut out from this can then be used for PV cells of any size. However, the advantageous reflection properties are then lost. Expediently therefore at least one side of the metal foil 30 should be tinned only in the areas which, after division into PV cell connectors, form the first areas 20 of the top broad side 12 of the PV cell connectors with which this is soldered to the bottom of a PV cell 29.

The foil ribbons 58 are a series of pre-tinned strips 10 (FIG. 10) according to the invention. The pre-tinned first areas 20 are on the top broad side 12 and the pre-tinned second areas 24 are on the bottom broad side 14 of each of the strips 10. The individual strips 10 are separated only by the cutting tolerance 28 of 0.5 mm. The first and second areas 20, 24 on opposite sides of the ribbon 58 are separated by the intermediate areas 22 within the strips 10 in its longitudinal direction.

All of the above-mentioned references are herein incorporated by reference in their entirety to the same extent as if each individual reference was specifically and individually indicated to be incorporated herein by reference in its entirety.

While the invention has been described with reference to preferred embodiments, it is to be understood that variations and modifications may be resorted to as will be apparent to those skilled in the art. Such variations and modifications are to be considered within the purview and scope of the invention as defined by the claims appended hereto.

What is claimed is:

1. A connector for PV cells comprising a strip of electrically conductive material which has a flat cross-section with a first and a second broad side extending over its entire length and having opposite edges and with two narrow sides which each connect to opposite edges of the broad sides,
    wherein
       at least the first broad side has a corrugated structure running in a longitudinal direction of the strip and extending over the whole length of the strip; and
       the first broad side is pre-tinned in a first area the length of which is somewhat less than the length of the edge of a PV cell; and
       the first broad side further comprises at least one untinned area.

2. The connector according to claim 1, wherein the second broad side also has a corrugated structure running in longitudinal direction of the strip.

3. The connector according to claim 2, wherein the second broad side is pre-tinned in a second area, the length of which is somewhat less than the length of the edge of a PV cell, and wherein the first area and the second area are separated in longitudinal direction of the strip by a gap which roughly corresponds to the distance between two PV cells connected to one another.

4. The connector according to claim 1, wherein at least the first area is pre-tinned with a quantity of solder such that the corrugated structure running in longitudinal direction is at least full.

5. The connector according to claim 4, wherein at least the first area is pre-tinned with a quantity of solder such that the solder stands slightly higher than the peaks of the corrugated structure.

6. A metal foil made of electrically conductive material with a corrugated structure running in a longitudinal direction of the metal foil on at least a first side of the metal foil, wherein the metal foil is adapted to be divided into connectors according to claim 1 and the first side of the metal foil has first areas which run in transverse direction and are pre-tinned.

7. The metal foil according to claim 6, wherein the pre-tinning fills up the corrugated structure and stands slightly higher than the peaks of the corrugated structure.

8. A ribbon in which connectors for PV cells according to claim 1 are arranged in one or several rows behind or alongside one another.

9. A first PV cell connected to a second PV cell using the connector for PV cells according to claim 1, wherein the pre-tinned first area of the first broad side of the strip is soldered to a bottom side of the second PV cell, and the at least one untinned area is oriented on a top side of the first PV cell.

10. A metal foil with a corrugated structure running in longitudinal direction on at least one side,
    wherein
       the corrugated structure extends over the whole surface of the at least one side;
       at least areas of the corrugated structure are completely filled with soldering tin; and
       the total area of the areas completely filled with soldering tin is less than the total area of the metal foil.

* * * * *